US 6,636,438 B2

(12) United States Patent
Ogura et al.

(10) Patent No.: US 6,636,438 B2
(45) Date of Patent: Oct. 21, 2003

(54) CONTROL GATE DECODER FOR TWIN MONOS MEMORY WITH TWO BIT ERASE CAPABILITY

(75) Inventors: Tomoko Ogura, Hopewell Jct., NY (US); Nori Ogura, Hopewell Jct., NY (US)

(73) Assignee: Halo LSI, Inc., Wappingers Falls, NY (US)

( * ) Notice: Subject to any disclaimer, the term of this patent is extended or adjusted under 35 U.S.C. 154(b) by 0 days.

(21) Appl. No.: 10/190,635

(22) Filed: Jul. 8, 2002

(65) Prior Publication Data

US 2003/0079540 A1 May 1, 2003

Related U.S. Application Data

(60) Provisional application No. 60/303,737, filed on Jul. 6, 2001.

(51) Int. Cl.[7] ................................................. G11C 16/04
(52) U.S. Cl. ............................ 365/185.18; 365/185.05; 365/230.04
(58) Field of Search ...................... 365/185.18, 185.05, 365/230.04, 230.06, 185.28, 185.29, 185.33

(56) References Cited

U.S. PATENT DOCUMENTS

| | | | | |
|---|---|---|---|---|
| 6,011,725 | A | 1/2000 | Eitan | 365/185.33 |
| 6,248,633 | B1 | 6/2001 | Ogura et al. | 438/267 |
| 6,459,622 | B1 | 10/2002 | Ogura et al. | 365/185.28 |
| 6,469,935 | B2 | 10/2002 | Hayashi | 365/185.18 |
| 6,504,756 | B2 * | 1/2003 | Gonzalez et al. | 365/185.18 |

* cited by examiner

*Primary Examiner*—David Lam
(74) *Attorney, Agent, or Firm*—George O. Saile; Stephen B. Ackerman

(57) ABSTRACT

The present invention is a decoder for control gate lines of a twin MONOS flash memory array. Decoder units connected to each control gate line of the memory are controlled to provide select, override and unselect voltages to perform read, program and erase operations. The decoder units are divided into odd and even addressing where separate voltages can be applied control gates of to adjacent memory cells. Override voltages, which prevent operations of a selected cell from affecting adjacent memory cell storage sites, can be applied to the control gates of immediate neighboring cells of the selected sell. Unselected voltages can be applied to beyond the immediate neighboring cells to further prevent disturb conditions in remote cells.

27 Claims, 4 Drawing Sheets

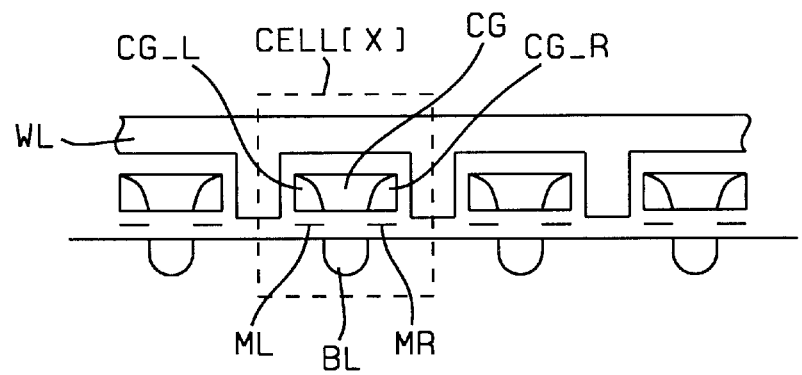
FIG. 1 – Prior Art
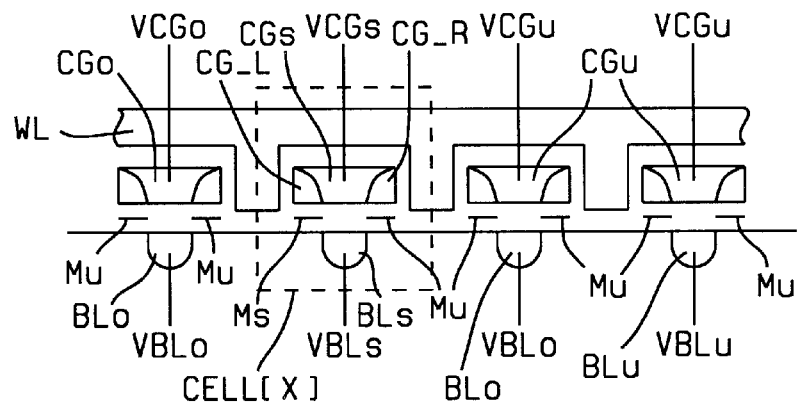
FIG. 2A
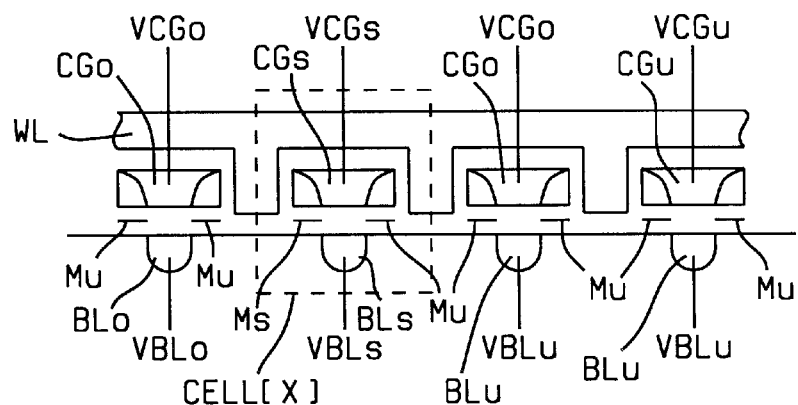
FIG. 2B

CONTROL GATE DECODER FOR TWIN MONOS MEMORY WITH TWO BIT ERASE CAPABILITY

This application claims priority to Provisional Patent Application serial No. 60/303,737, filed on Jul. 6, 2001, which is herein incorporated by reference.

BACKGROUND OF THE INVENTION

1. Field of Invention

The present invention relates to integrated circuit design for semiconductor memory and more specifically a control gate decoder for dual gate memory cells and specifically a twin MONOS EEPROM.

2. Description of Related Art

Both Flash and MONOS EEPROM are comprised of an array of cells that can be independently programmed and read. Select transistors can be added to the array to cut the capacitance on lines, and can be used to enable cells to be erased. Metal Oxide Semiconductor (MOS) field effect transistors are the individual memory units of both types of EEPROMS. The Flash MOS transistor includes a source, drain, and floating gate with a control gate connected to a Word Line (WL). Various voltages are applied to the word line to program the cell with a binary "1" or "0", or to erase the cell.

In the conventional MONOS MOS transistor the programmable component under the control gate in the MONOS device is a nitride layer as shown in FIG. 1, which is a cross section of a twin MONOS array. The twin MONOS memory unit is comprised of a control gate CG with a left and right component, CG_L and CG_R, under which two separate sites, ML and MR, are used as storage sites in the composite nitride layers. The bit line diffusion, BL, lies under the control gate, CC, and an independent polysilicon word line, WL, lies between the control gates of adjacent cells. The array scheme U.S. Pat. No. 6,011,725 (Eitan) is directed toward a polysilicon word line routed above the control gates of the cells connected to the word line WL. A twin MONOS memory structure is referenced in U.S. Pat. No. 6,248,633, (Ogura, et al.). Various voltages applied to the control gate CG in combination with bit line BL and word line WL voltages, are used to program the left and right cell components with a binary "1" or "0". The separate word line polysilicon provides additional control that enables the operation of the control gates.

U.S. Pat. No. 6,248,633 (Ogura et al) is directed toward a twin MONOS cell structure having an ultra short control gate channel with ballistic electron injection into the nitride storage sites and fast low voltage programming. U.S. patent application Ser. No. 10/099,030 dated Mar. 15, 2002 is directed toward providing a method of memory cell selection and operation to obtain wide program bandwidth and EEPROM erase capability in a MONOS memory cell. U.S. patent application Ser. No. 09/810,122 dated Mar. 19, 2001 is directed toward an array architecture of nonvolatile memory and its operation methods using a metal bit diffusion array.

EEPROM memory cells in an array of rows and columns may be connected in various configurations such as NAND or NOR, both of which require different decode strategies for the control gate and word lines. In a NAND arrangement, the cells in a column are connected in series with the source of one cell connected to the drain of the cell in the next row. Control gates (for MONOS EEPROM) are connected across columns in a row along with word line so that all cells in a word line row must be selected. The word line decoder supplies one word line with a select voltage, while applying an override voltage to all other unselected word lines within a block.

Another type of decoder is used in conjunction with a NOR type memory configuration, where the control gates of the cells in a row are connected. The drains of the cells in a column are connected to a bit lines, and the sources of the cells in one row are connected together. In this typical NOR arrangement, a decoder would select one row by selecting a word line while all other word lines are unselected.

SUMMARY OF THE INVENTION

It is an objective of the present invention to provide a control gate line decoder for a twin MONOS EEPROM memory array.

It is also an objective of the present invention to provide a control gate line decoder which allows for one or more bit selection within a word line during read and program operations.

It is also another objective of the present invention to provide a control gate line decoder for a two bit erase.

It is still another objective of the present invention to provide a control gate line decoder for a block erase.

It is yet another objective of the present invention to provide a control gate line decoder for incorporating the voltage selection requirements of a dual bit memory array.

It is still yet another objective of the present invention to provide a control gate line decoder that can override voltages on left and right neighboring control gates.

In a higher density dual bit type array, such as a twin MONOS memory array shown in FIG. 1, one bit line of a cell is shared between two storage sites called "hard bits". A selected memory cell requires specific voltage conditions not only on the bit line of the selected cell, but also on the bit line of the neighbor cell. The bit line of the neighbor cell is adjacent to the selected storage site of the selected cell. Therefore, if the left hard bit of a cell is selected, then the neighbor cell is to the left, and if the right hard bit of a cell is selected then the neighbor cell is to the right.

During a single hard-bit operation, one bit line provides the source voltage while an adjacent bit line provides the drain voltage. The dual bit type array is similar to the NOR type configuration where all bit line diffusions passing under a word line are separately connected to an individual bit line, but differs from the NOR in that all diffusions in a column are connected to a respective bit line. In a matrix configuration, the word line is connected to all the word line polysilicon segments in a row, and is thereby the mechanism through which one row array is selected. However, each control gate of a cell is separate from the word line of a row, connecting columns through control gate lines (CG) running perpendicular to the word lines and parallel to the bit lines. This allows selection of specific control gate lines within a row of memory cells.

The control gate selection is similar to bit line selection in a NOR type matrix configuration with the requirement of neighbor cell bit line voltages in addition to the selected cell voltages during single hard-bit operation. If one out of Y cells are selected during a particular mode, then one out of Y control gate lines will hold the selected voltage VCGs, while the control gates of corresponding neighbor cells can be applied with an override voltage VCGo. The selected word line determines the row selected, but the control gate lines determine the columns in that row that are selected. In providing the correct voltages on the control gate lines, a decoder specifically designed for control gate lines needs to be connected to the memory matrix.

Under both read and program operating conditions, a MONOS Memory requires the application of a particular override voltage to the control gates adjacent to the control gates of the selected cell. If the left storage site of a cell is selected to be read, or programmed, the neighboring control gate to the left of the storage site requires an override voltage, and similarly if the right storage site is selected, the neighboring control gate on the right requires the override voltage.

An override voltage used during a read operation blocks the effects of a neighboring adjacent cell on the cell selected to be read. During a program operation and an erase operation, the override voltage is used on neighboring cells to block the effects of the selected cell on the unselected neighboring cell. For a read operation an override voltage is applied to the control gate of an adjacent cell, which is greater than the control gate voltage of the selected cell, preventing the adjacent cell from affecting the read operation of the selected cell. For a program operation an override voltage is applied to the control gate of an adjacent cell, which is lower than the control gate voltage of the selected cell, preventing the adjacent cell from being selected.

There are various schemes for selecting the left or right storage sites for read and program operations. In FIG. 2A the left side of Cell[x] is selected and one strategy would be to simply apply the control gate override voltage to only the immediate neighbor of the selected cell. Bit line voltages on neighbor cells may be the same since a left/right override selection is through the control gates. A second scheme shown in FIG. 2B is to apply the same override voltages on both the left and right neighbor of the selected cell, and differentiating the position of the override cell through the BL voltages. Both these strategies are possible using the decoding scheme proposed herein.

Simultaneous erase of the left and right components of a twin MONOS memory unit requires a negative voltage applied to the respective control gate, and a positive voltage on the corresponding bit line. Unselected control gates may be held at 0V, with no consideration for an override voltage.

During read or program, the decoder provides override voltages on both left and right control gates of neighbor cells, or just on the control gate immediately adjacent to the selected control gate component. The control gate decoder supplies any unselected cell (not including override cells) with an unselected voltage, typically 0V. The control gate decode unit associated with an individual control gate line, is comprised of two blocks of pass transistors.

Depending on the voltage selection and timing requirements, the blocks of a decode unit may be implemented as a single high voltage transistor or a complementary transmission gate. One block passes the high voltages using a PMOS transistor as the main component using the high control gate voltage at the source and the control gate line connected to the respective memory cell as the drain. The high control gate voltages passed by the decode block are the selected and override control gate voltages used during read or program and the unselected cell voltages during erase.

The second block of the decode unit passes the low voltages to the control gate line, with an NMOS transistor as the fundamental component using the low control gate voltage for a source bias and the control gate line for the drain connection. Both blocks share an input signal YCG provided by logic circuits, which switch the control gate line between the high and low voltages. The control gate decoder is in itself, an array of decode units that parallels the memory array, with one decode unit for each control gate line. A group of control gate decoders has individual YCG input signals so that corresponding control gate lines may be selectively connected to the correct voltages. Even decode units belonging to even control gate lines all have high voltage lines connected to a single VCGHIEV line. Similarly, odd decode units belonging to odd control gate lines all have high voltage lines connected to a single VCGHIOD line. Thus a cell, whether even or odd, can have the selected control gate high voltage at the same time that the neighbor cell sees a different high voltage for overriding a control gate. In the control gate decode scheme of the present invention, all the low voltage lines from the decode units are connected to a single VCGLO line without respect to even or odd cells. The low voltages for the twin MONOS memory of the present invention are applied to all unselected cells during read or program and to selected cells during erase mode.

BRIEF DESCRIPTION OF THE DRAWINGS

This invention will be described with reference to the accompanying drawings, wherein:

FIG. 1 is a cross section of a twin MONOS array of prior art,

FIGS. 2A and 2B are cross sections of the twin MONOS array of prior art showing voltages of the present invention for the selected cell and override voltages for the immediate neighbor.

DETAILED DESCRIPTION OF THE PREFERRED EMBODIMENTS

Figure 3A:
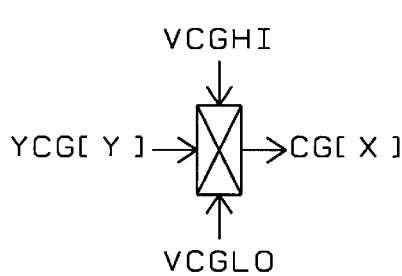
FIGS. 3A through 3E show various forms of the pass transistor of the present invention.

FIG. 1 shows the basic cross-sectional structure of prior art of an array of the twin MONOS memory. Each cell in an array, for example Cell[x], contains two storage sites (memory cells) which are separate nitride layers one on the left ML and one on the right MR. Both storage sites (memory cells) are in the oxide under one control gate CG with left and right-side components CG_L and CG_R. The bit line diffusion BL lies under the control gate CG, and the word line poly WL. The word line WL is above the control gates and separates the control gates of individual memory cells. For both read and program operating conditions, the twin MONOS memory requires the application of an override voltage VCGo to the unselected neighbor control gates CGo adjacent to the control gate CGs of the selected cell in an array.

There are various schemes for selecting the left or right side of a cell for both read and program operations. FIGS.

2A and 2B illustrate two schemes of the present invention for selecting the left side Ms of Cell[x]. If the left control gate CG_L of CELL [X] is selected to be read or programmed, the neighbor control gate to the left becomes the override control gate CGo requiring an override voltage VCGo, which is different from the selected cell control gate voltage VCGs and the unselected cell control gate voltage VCGu. Similarly if the right side cell CG_R is selected, the neighbor control gate on the right of the selected cell control gate CGs requires the override voltage VCGo. The strategy just described applies the override voltage VCGo to only the immediate neighbor of the selected cell. Therefore, bit line voltages on neighbor cells may both be equal to VBLo since left or right override selection is through the control gates.

A second scheme illustrated in FIG. 2B applies the same override voltages VCGo on both the left and right neighbor control gates CGo, and differentiates the position of the override cell through the bit line voltages. Both these strategies are possible using the decoding scheme proposed herein but for simplicity the focus will use the second CG control gate decode scheme where override voltages are applied on both neighbor control gates regardless of whether the selected cell component is left or right.

TABLE 1

| Voltage Conditions | Selected VCG | Override Neighbor VCGo | Rest of Unselected VCGu |
|---|---|---|---|
| Read | VCGHIA = 1.5 V | VCGHIB = 3.0 V | VSS = 0V |
| Program | VCGIHC = 5.0 V | VCGHID = 2.5 V | VSS = 0V |
| Erase | VCGLOA = −3.0 V | — | VCGHIE = 0V |

The general voltage conditions of the control gates are summarized in Table 1. All operating modes require that a pass transistor unit transmit either a high voltage VCGHI or a low voltage VCGLO to an individual control gate line. During Read VCGHI=VCGHIA, which is approximately 1.5V, or VCGHI=VCGHIB, which is 3.0V for select and override voltages. During program VCGHI=VCGHIC (approximately 5.0V) or VCGHI=VCGHID (approximately 3.0V) for select and override voltages. The low voltage VCGLO=VSS is connected as an unselect voltage during read or program, and as a select voltages during erase is VCGLO=VCGLOA (approximately −3V). During erase, the unselect voltage is VCGHI=VCGHIE (approximately in the range from 0 to 3V). The voltage VCGHI switches between VCGHIA, VCGHIB, VCGHIC, VCGHID, and VCGHIE depending on the mode. The voltage VCGLO switches between VSS and VCGLOA.

Figure 3B:
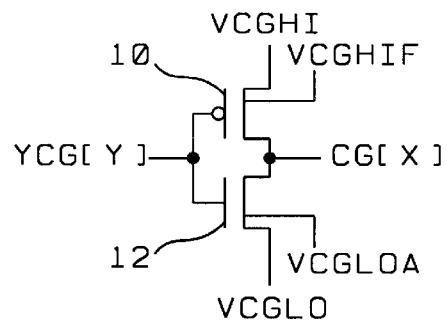
Figure 3C:
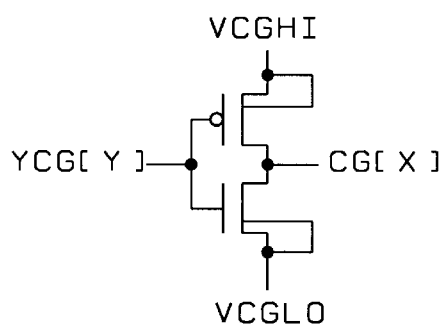

FIG. 3A is a symbol of the decode unit for passing VCGHI or VCGLO to a particular control gate line CG[X]. FIG. 3B is the schematic representation of the decode unit and is comprised of two transistors: a first transistor 10 for passing VCGHI and the second transistor 12 for passing VCGLO. FIG. 3C shows the decode unit as an inverter like unit comprised of a PMOS and a NMOS transistor. The PMOS transistor source is connected to VCGHI, and the NMOS transistor source is connected to VCGLO. Both drains of the two transistors are connected through to a control gate line CG[X], and both gates are connected to input signal YCG[Y]. If the YCG input is high (VCGHIF= greater than or equal to VCGHI), then VCGLO is passed to the control gate, and if YCG is low (less than or equal to VCGLO), VCGHI is passed to the control gate line CG[X]. Generally level shifters will raise logic signals from a high of VDD to VCGHIF and reduce lows of 0V to VCGLOA (0V or −3V during erase) to produce the YCG signals. It is possible for the substrate of the PMOS transistor to be connected to a corresponding VCGHI source and the NMOS transistor to be connected to a corresponding VCGLO source. However between selecting different cells during read and program, the VCGHI voltage may switch between a select and override voltage, and would have to carry a considerable substrate load. Therefore, all the PMOS substrates are connected together to VCGHIF, the highest VCGHI voltage during the read or program modes. The NMOS substrates are also connected together to VCGLOA, which is the lowest voltage during the read and program modes (VCGLOA=VSS or lower during Read and Program, and −3V during Erase).

Figure 3D:
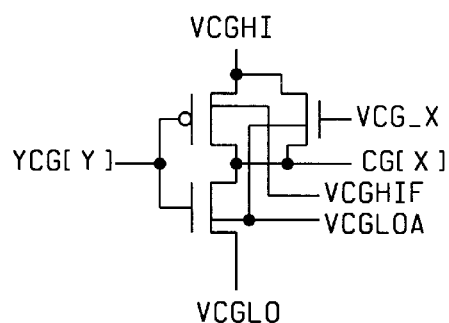
Figure 3E:
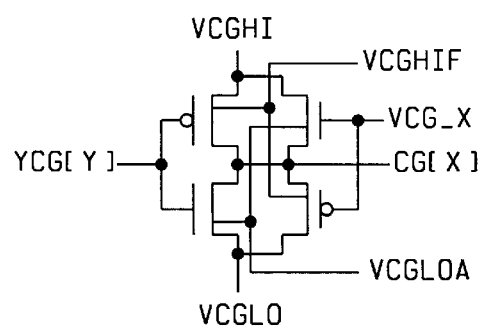

The PMOS transistor and the NMOS transistor in FIG. 3C can be substituted for a complementary switch (or CMOS transmission gate) as shown in FIG. 3D and FIG. 3E. Both the PMOS and NMOS transistors need to be high voltage devices to withstand the extremes of voltages during program and erase. During read when a lower VCGHI is used, which is closer to the threshold voltage of the PMOS device, the lower drivability of the pass transistor may be a consideration. Faster operation may be obtained with complementary logic, as well as a higher ON voltage for YCG, and even a timed overshooting of the VCGHI. It is possible to precharge all the VCGHI lines of the decoders to the highest voltage of the operating mode (VCGHIB during Read or VCGHIC during Program), so that time for charging up the VCGHI lines does not present a timing problem. During Erase when a decode unit passes the unselect control gate voltage VCGu, a complementary switch is needed if VCGHIE is near or below the threshold voltage of the PMOS transistor.

FIG. 3E is along the same lines as FIG. 3D, further substituting a transmission gate for the simple NMOS transistor [12]. This allows faster passing of the voltage VCGLO when the voltage is high and near the threshold of the NMOS transistor. This allows passing of high voltages higher than the threshold of the NMOS transistor to CG[X]. In this way, the voltage VCGLO may be used to pass either low or high voltages notably with an erase operation, VCGs or VCGu).

Figure 4:
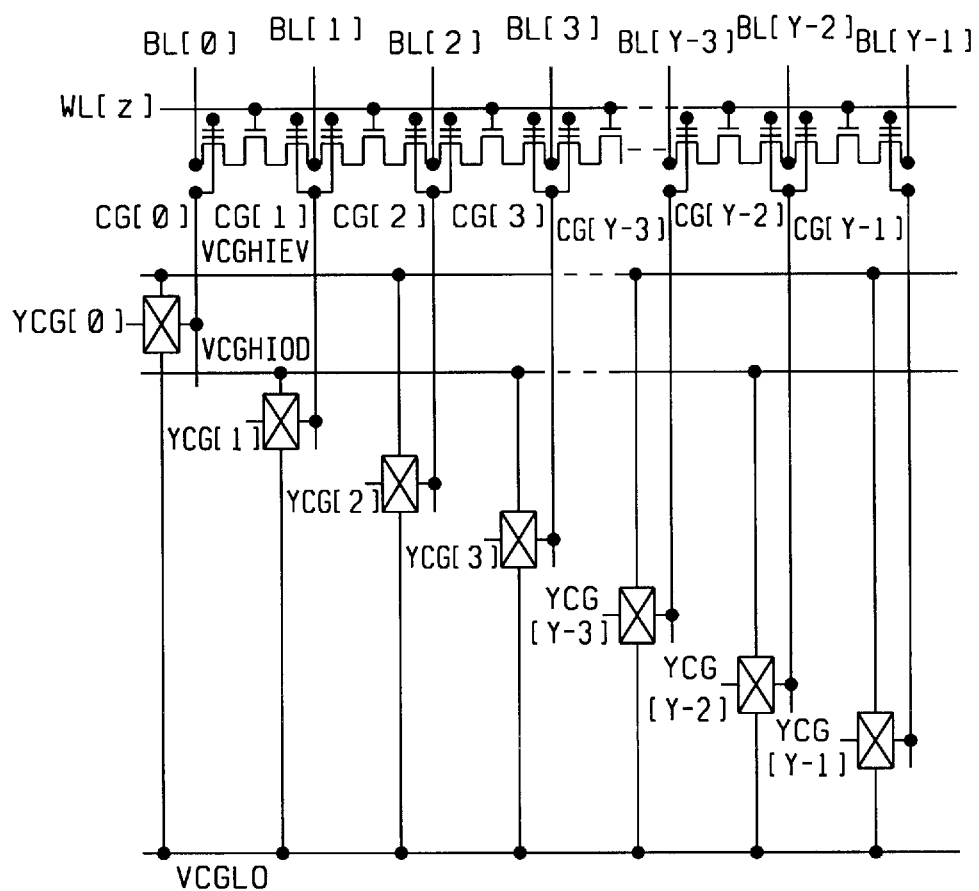
FIG. 4 shows a structure of a sub-unit control gate decoder connected to an array of memory of the present invention.

FIG. 4 shows an example of the structure of a sub-unit control gate decoder connected to an array of memory. Whether the immediately adjacent neighbor control gate or both neighbor control gate lines are raised to the high override voltage VCGo, the control gates of the selected cells will have a different high voltage VCGs than the overridden neighbor cells. Therefore, all VCGHI lines from the decode unit, shown in FIG. 3A, for all even cells is connected to a high voltage line VCGHIEV, separate from the high voltage line VCGHIOD for all odd cell control gate lines. Depending on whether the selected cell is even or odd, the VCGHIEV and VCGHIOD lines will have to switch between the correct select voltage VCGs and override voltage VCGO for the read or program operations as detailed in Table 2.

TABLE 2

| Selected CG[X] | BL_OD | VCGHI_SWITCH Output | | VCGLO Output |
| --- | --- | --- | --- | --- |
| | | Selected VCGs | Override VCGo | Rest of unselected VCGu |
| X = 0, 2, 4, . . . Read/Prog. | "L" | Line: VCGHIEV = VCGHIA/VCGHIC | Line: VCGHIOD = VCGHIB/VCGHID | Line: VCGLO = VSS/VSS |
| X = 1, 3, 5, . . . Read/Prog. | "H" | Line: VCGHIOD = VCGHIA/VCGHIC | Line: VCGHIEV = VCGHIB/VCGHID | Line: VCGLO = VSS/VSS |

Figure 5A:
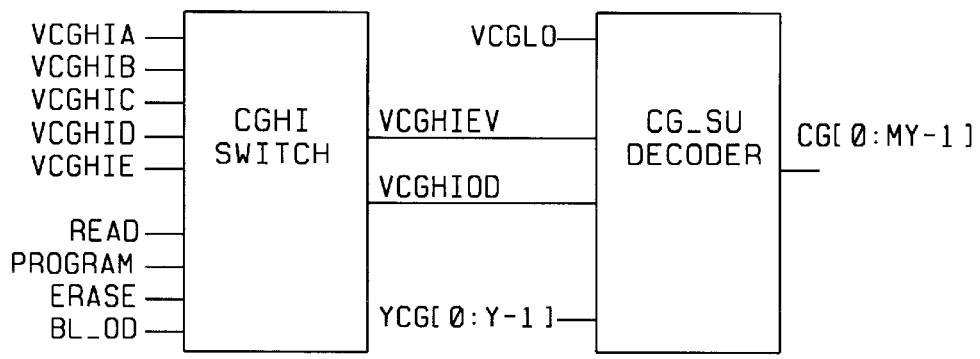
FIG. 5A is a block diagram of a CGHI switch of the present invention.

FIG. 5A is a block diagram of a CGHI switch, which produces the correct VCGHIEV and VCGHIOD voltages from the input voltages VCGHIA, VCGHIB, VCGHIC, VCGHID, VCGHIE along with the input signals of the operating modes, Read, Program, and Erase, and for BL_OD. When BL_OD is low "L", the selected cell is odd, and its corresponding bit line BLs and control gate CGs are odd. Then the selected cell voltage VCGs is applied to VCGHIOD, and the override cell voltage VCGo= VCGHIEV. In like manner, when BL_OD is high "H", the selected cell is odd, and its corresponding bit line BLs and control gate CGs is even. Then the selected cell voltage VCGs is applied to VCGHIEV, and the override cell voltage VCGo=VCGHIOD. During read or program, all the rest of the control gates of the unselected cells CGu are at a low voltage VCGu=VSS, which is connected through to the VCGLO line. Since select and override voltages are carried on separate lines, the pass transistors for decode need only switch between VCGLO and VCGHI controlled by the YCG input signals, where VCGHI=VCGHIEV for even cell control gates and VCGHI=VCGHIOD for odd cell control gates.

As long as the cell decode units are arranged in groups of Y, where Y is an even number greater than or equal to 4 (one selected cell+one cell with an overridden control gate+two unselected cells, or one selected cell+two cells with overridden control gates+one unselected cell), then 1 out of Y cells can be read and programmed simultaneously within a selected control gate sub-unit decoder (shown in FIG. 5A). If there are M groups of Y decoders, then M cells are read or programmed simultaneously within the selected Sub-unit. The inputs YCG[y] to the decoder, where y=0 . . . Y−1, are connected sequentially to the individual decode units so that control gates CG[m*Y+y] (where m=0 . . . M−1) corresponds to decode input signals YCG[y]. The corresponding YCG[y] input signals of the selected control gates and the unselected neighbor control gates CGo can be selected to be low "L" to allow application of VCGHI voltages. With the rest of the YCG signals in the group "H", VCGLO is passed to the unselected cells CGu. For the first left/right control gate decode scheme, where CG[m*Y+y] is the selected control gate line, YCG[y] is low. If the left cell is selected, then YCG[y−1] is low as well while all other YCG signals are high. If the right cell is selected, then YCG[y] and YCG[y+1] are low while all other YCG signals are high. For the scheme where both neighbors are brought to override voltages, both YCG[y−1] and YCG[y+1] are low in addition to the selected cell YCG[y]. For both schemes if the selected memory cell is the first in a sub-group y=0, then the left adjacent memory cell is in the left adjacent sub-group y=Y−1; and if the selected cell is the last in a sub-group Y−1, then the right adjacent cell is in the right adjacent sub-group y=0. Care must be taken in considering the edge of the memory array and redundant cells within a sub-block. It is possible to provide separate YCG signals to the left edge control gates (CGEL) and right edge control gates (CGER), for example YCGEL and YCGER. As well as individual YCGR[O . . . R−1] signals for redundant CGR[O . . . R−1], where R is equal to the number of redundant cells within a Sub-block.

Figure 5B:
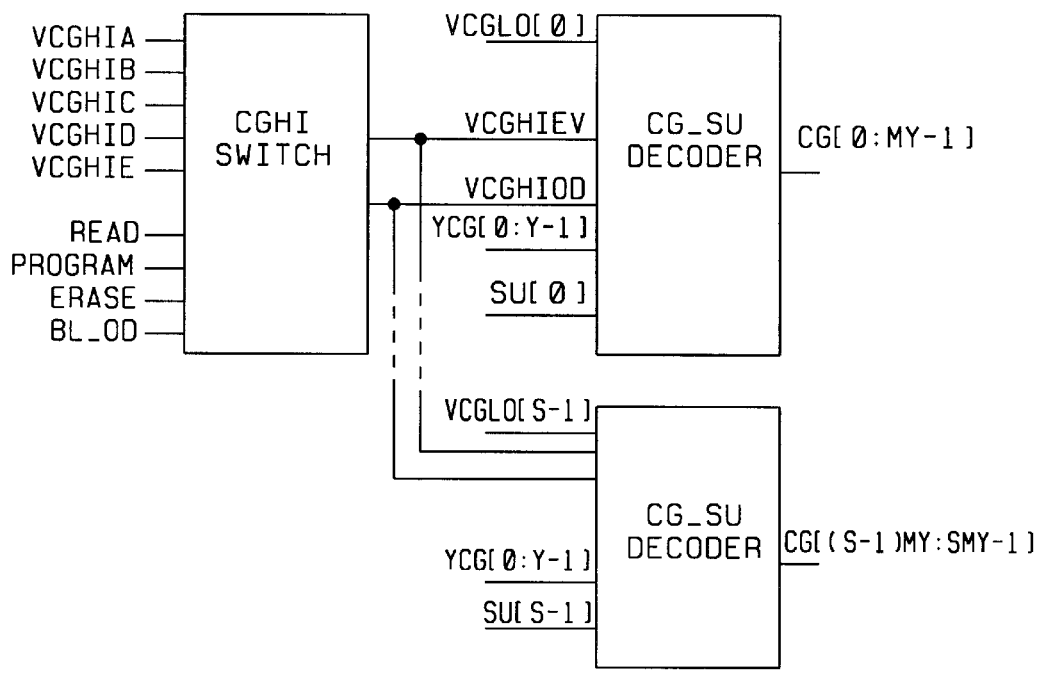
FIG. 5B is a block diagram of a CGHI switch connected to a control gate decoder of a plurality of sub-units of the present invention.
Figure 6A:
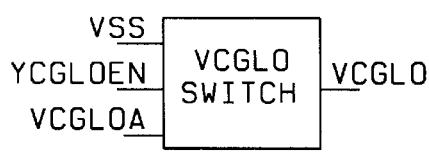
FIG. 6A is a block diagram of the CGLO switch of the present invention.
Figure 6B:
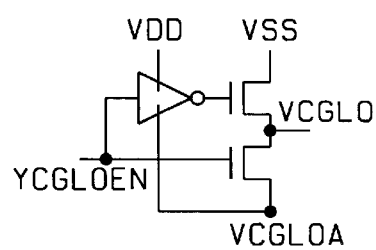
FIG. 6B is a schematic diagram of the CGLO switch of the present invention.

FIG. 5B is a block diagram of a CGHI driver connected to a control gate decoder of several sub-units, where S equals the number of sub-units. In the selection of one sub block out of many, the active low YCG signal inputs to each control gate sub-unit decoder can be ORed during read or program operations with an active low sub-unit signal SU[s], where s=0 . . . S−1, so that YCG[y] is low "L" only when the corresponding sub unit signal SU[s] for that sub-block is "L" for active low operation during read and program operations. As seen in Table 2, a CGLO switch shown in FIG. 6 is not an integral part of the read and program operations since all unselected cells, CGu, within selected and unselected sub-units require the same low voltage, VSS, regardless of which control gate line is selected. The CGLO switch with a sub-unit enable input signal YCGLOEN becomes significant during erase conditions documented in Table 3, when the CGLO switch produces the VCGLO voltage that is applied to the selected control gates CGs, the CGHI driver produces VCGHIEV and VCGHIOD to provide the unselected CGu voltage.

TABLE 3

| Selected CG[X} | Selected CG[X] Voltage | Rest of unselected CG[X] |
| --- | --- | --- |
| X = 0, 1, 2, 3, 4, . . . | Line: VCGLO = VCGLOA | Line: VCGHIEV = VCGHIOD/VCGHIE |

The CGLO_SWITCH symbolized in FIG. 6 switches an output voltage VCGLO to VCGLOA (about to −3V) during erase mode for the selected control gate voltage VCGs. If however this is not the case, then the pass transistors for voltages VSS and VCGLO, with inputs YCGLOEN and YCGLOEN_X, can be used to switch between VSS and VCGLOA. The input YCGLOEN is high (VDD) for selected sub-units allowing the voltage VCGLOA to pass to the control gate decoders VCGLO. If the sub-unit is unselected and the signal YCGLOEN is low (less than or equal to VCGLOA), then VCGLO=VSS so that cells selected through YCG[x] (FIG. 4) are passed the unselected cell voltage VSS. During read or program operations the state of input YCGLOEN can remain the same so VCGLO sees VSS no matter which sub-unit is chosen as described in Table 4.

TABLE 4

| Voltage Conditions | VCGLO | YCGLOEN | All cells VCGLOA |
|---|---|---|---|
| Read/Program | VSS | VCGLOA | VSS to −3 V |
| Erase | −3 V Constant or switchable | VDD/VCGLOA | −3 V |

During Erase mode, if all cells in a WL are to be erased, the control gate voltage VCGLOA needs only to be lowered to the correct select erase voltage (approximately −3V) and all decoder input signals YCG[0 . . . Y−1] set high to pass the voltage VCGLOA to all the selected control gates CGs. However, as in the read and program modes, one control gate in a group of Y control gates, can be selected for erase through the corresponding decoder input signal now active high so that YCG[y] is high and the rest of the input signals YCG are low. Sub-units are selected through an input signal YCGLOEN (active high) for the VCGLOA switch to pass VCGLOA=−3V to VCGLO, which is subsequently passed to selected cell control gates. For unselected sub-units YCGLOEN is low and passes VSS to VCGLO which is applied the unselected control gates. It should be noted that with these voltage conditions during any of the operating modes, only one low voltage in a sub-unit is required at the one time. Therefore, only one VCGLO line is connected to all the decode units within a sub-unit. If however, erase was a scheme similar to read and program, and a neighbor cell required a different low voltage from the selected cell and other unselected cells, separate VCGLOEV and VCGLOOD lines could be provided. Separate VCGLOEV and VCGLOOD lines instead of a single VCGLO line could even be used in read or program operations, if for example, another unselect voltage was required.

In the variations described herein, sub-unit select could be logically combined with the YCG[0 . . . Y−1] for active low input signals during program and read operations. During erase, sub-unit select was enabled through the YCGLOEN input signal to the VCGLO switch. However, it is possible for the YCG input signals to be combined with sub-unit select to provide active high input signals during Erase.

Similarly, if each sub-unit had its own individual VCGHI switch with enable signal YCGHIEN, then the voltage VCGHI for unselected sub-units could be switched to an unselected sub-unit voltage.

Table 5 shows a summary of the voltage erase conditions for selected and unselected control gates and provided by the control gate decoder. These voltage conditions are for situations including all cells in a memory unit being erased, one cell of Y cells in all sub units being erased, one cell in Y cells in selected sub units being erased, one cell in Y cells, either odd or even numbered, in all sub units being erased, and one cell in Y cells, either odd or even numbered, in selected sub units being erased.

TABLE 5

| Voltage Erase Conditions | Selected Control Gate (CGs) | Corresponding CG in unselected Sub-unit | Rest of unselected | Unselected Neighbor Control Gates | YCGLOEN |
|---|---|---|---|---|---|
| V1. All Cells | VCGLO = VCGLOA −3 V | — | — | — | All High |
| V2. 1 cell in Y in all sub-units | VCGLO = VCGLOA −3 V | — | VCGHI = 2.5 V | — | All High |
| V3. 1 cell in Y in selected sub-units | VCGLO = VCGLOA −3 V | VCGLO = VSS = 0 V | VCGHI = 2.5 V | — | Selected sub-unit YCGLOEN High |
| V4. 1 cell in Y in all sub-units BL_OD = 0 V BL_OD = VDD | VCGLO_EV = −3 V VCGLO_OD = −3 V | — | VCGHI = VSS = 0 V | VCGLO_OD = 2.5 V VCGLO_EV = 2.5 V | All High |
| V5. 1 cell in Y cells in selected sub units BL_OD = 0 V BL_OD = VDD | VCGLO_EV = −3 V VCGLO_OD = −3 V | VCGHI = VSS = 0 V | VCGHI = VSS = 0 V | VCGLO_OD = 2.5 V VCGLO_EV = 2.5 V | Selected sub-unit YCGLOEN High |

While the invention has been particularly shown and described with reference to preferred embodiments thereof, it will be understood by those skilled in the art that various changes in form and details may be made without departing from the spirit and scope of the invention.

What is claimed is:

1. A method for selecting a storage site within a twin MONOS flash memory for reading and programming using control gate override selection, comprising:

a) selecting a first memory cell containing a first and a second storage site, b) selecting said first storage site within said first memory cell, c) selecting a first control gate above said first storage site, d) applying a "selected" voltage to said first control gate, e) selecting a second control gate above an unselected storage site within a second memory cell which is immediately adjacent to said first storage site, f) applying an "override" voltage to said second control gate, g) selecting a third control gate within a third memory cell which is above a second unselected cell and is not immediately adjacent to said first storage site, h) applying an "unselected" voltage to said third control gate.

2. The method of claim 1, further comprising:
a) applying a bit line select voltage to a first bit line connected to said first memory cell,
b) applying a bit line override voltage to a second bit line connected to memory cells left and right adjacent to said first memory cell,
c) applying a bit line unselect voltage to a third bit line memory cell not immediately adjacent to said first memory cell.

3. The method of claim 2, wherein said third memory cell containing said third control gate is immediately right of said first memory cell.

4. The method of claim 3, wherein said third memory cell containing said third control gate is immediately left of said first memory cell.

5. The method of claim 1, wherein said first storage site within said first memory cell is a left storage site and said second memory cell containing said second control gate is immediately left of said first memory cell.

6. The method of claim 1, wherein said first storage site within said first memory cell is a right storage site and said second memory cell containing said second control gate is immediately right of said first memory cell.

7. A method for selecting a storage site within a twin MONOS flash memory for reading and programming using bit line override selection, comprising:
a) selecting a first memory cell containing a first and a second storage site,
b) selecting said first storage site within said first memory cell,
c) selecting a first control gate above said first storage site,
d) applying a "selected" voltage to said first control gate,
e) selecting a second control gate above an unselected storage site within a second memory cell which is immediately adjacent to either side of said first memory cell,
f) applying an "override" voltage to a second control gate,
g) selecting a third control gate within a third memory cell which is not immediately adjacent to said first memory cell,
h) applying an "unselected" voltage to said third control gate.

8. The method of claim 7, further comprising:
a) applying a bit line select voltage to a first bit line connected to said first memory cell,
b) applying a bit line override voltage to a second bit line connected to said memory cell immediately adjacent to said first storage site,
c) applying a bit line unselect voltage to a third bit line of memory cells not immediately adjacent to said first storage site.

9. The method of claim 8, wherein said first storage site within said first memory cell is a left storage site and said second memory cell containing said second bit line is immediately left of said first memory cell.

10. The method of claim 9, wherein said third memory cell containing said third bit line is immediately right of said first memory cell.

11. The method of claim 8, wherein said first storage site within said first memory cell is a right storage site and said second memory cell containing said second bit line is immediately right of said first memory cell.

12. The method of claim 11, wherein said third memory cell containing said third bit line is immediately left of said first memory cell.

13. A control gate line decoder for an array containing twin MONOS flash memory cells, comprising:
a) a decoder for control gate lines of a memory array,
b) said control gate lines connected to a plurality of twin MONOS memory cells within said memory array,
c) said decoder containing a plurality of decoder units connected to a plurality of said control lines,
d) said plurality of decoder units divided into a plurality of odd and a plurality of even assigned addresses matching address of said memory cells,
e) said plurality of odd assigned address decoder units connecting a low voltage or an odd assigned voltage to control gate lines with odd assigned addresses,
f) said plurality of even assigned address decoder units connecting said low voltage or an even assigned voltage to control gate lines with even assigned addresses.

14. The control gate line decoder of claim 13, wherein said decoder units are comprised of two or more transistors which upon receiving a decoder signal connect a control gate low voltage or a control gate high voltage to said control gate lines.

15. The control gate line decoder of claim 13, wherein an even addressed decoder unit of said plurality of even assigned address decoder units provides a control gate select voltage to an even addressed control gate line and an odd addressed decoder unit of said plurality of odd assigned address decoder units provides a control gate override voltage to an odd addressed control gate line immediately address adjacent to said even addressed control gate line.

16. The control gate line decoder of claim 13, wherein an even addressed decoder unit of said plurality of even assigned address decoder units provides a control gate select voltage to an even addressed control gate line and a first odd addressed decoder unit of said plurality of odd assigned address decoder units provides a control gate override voltage to a first odd addressed control gate line immediately address adjacent to said even addressed control gate line, and a second odd addressed decoder unit of said plurality of odd assigned address decoder units provides said control gate override voltage to a second odd addressed control gate line immediately address adjacent to said even addressed control gate line.

17. The control gate line decoder of claim 13, wherein an odd addressed decoder unit of said plurality of odd assigned address decoder units provides a control gate select voltage to an odd addressed control gate line and an even addressed decoder unit of said plurality of even assigned address decoder units provides a control gate override voltage to an even addressed control gate line immediately address adjacent to said odd addressed control gate line.

18. The control gate line decoder of claim 13, wherein an odd addressed decoder unit of said plurality of odd assigned address decoder units provides a control gate select voltage to an odd addressed control gate line and a first even addressed decoder unit of said plurality of even assigned address decoder units provides a control gate override voltage to a first even addressed control gate line immediately address adjacent to said odd addressed control gate line, and a second even addressed decoder unit of said plurality of even assigned address decoder units provides said control gate override voltage to a second even addressed control gate line immediately address adjacent to said odd addressed control gate line.

19. The control gate line decoder of claim 13, wherein said decoder units are controlled by a decoder signal to provide an "unselected" voltage to control gate lines not selected.

20. The control gate line decoder of claim 13, wherein said decoder units are controlled by a decoder signal to provide a selected voltage to selected control gate lines.

21. The control gate line decoder of claim 13, wherein said decoder units are controlled by a decoder signal to provide an override voltages on said control gate lines that are left and right neighbors of a selected control gate line.

22. A means for decoding control gate signals for a twin MONOS flash memory, comprising:
   a) a first decoding means to select a first voltage from a first plurality of voltages to connect to a first control gate line,
   b) a second decoding means to select a second voltage from a second plurality of voltages to connect to a second control gate line,
   c) a third decoding means to select a third voltage from said first plurality of voltages or from said second plurality of voltages to connect to a third control gate line,
   d) a first addressing means to assign said first plurality of voltages to even addressed control lines,
   e) a second addressing means to assign said second plurality of voltages to odd addressed control lines.

23. The means of claim 22, further comprising:
   a) the first decoding means to select said first voltage connects a control gate select voltage to a control gate of a selected memory cell,
   b) the second decoding means to select said second voltage connects an override voltage to a control gate of a memory cell neighboring said selected memory cell.

24. The means of claim 23, wherein said second decoding means selects said second voltage to connect said override voltage to cells neighboring both sides of said selected memory cell.

25. The means of claim 22, further comprising:
   a) the second decoding means to select said second voltage connects a control gate select voltage to a control gate of a selected memory cell,
   b) the first decoding means to select said first voltage connects an override voltage to a control gate of a memory cell neighboring said selected memory cell.

26. The means of claim 25, wherein said first decoding means selects said first voltage to connect said override voltage to cells neighboring both sides of said selected memory cell.

27. The means of claim 22, wherein the means to select said third voltage connects an unselected voltage to a control gate of a memory cell not selected for memory operations.

* * * * *